United States Patent
Tang et al.

(10) Patent No.: US 10,319,626 B1
(45) Date of Patent: Jun. 11, 2019

(54) INTERCONNECTS WITH CUTS FORMED BY BLOCK PATTERNING

(71) Applicant: GLOBALFOUNDRIES Inc., Grand Cayman (KY)

(72) Inventors: Minghao Tang, Ballston Lake, NY (US); Rui Chen, Clifton Park, NY (US); Yuping Ren, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/834,151

(22) Filed: Dec. 7, 2017

(51) Int. Cl.
  *H01L 21/033* (2006.01)
  *H01L 21/768* (2006.01)

(52) U.S. Cl.
  CPC .... *H01L 21/76816* (2013.01); *H01L 21/0332* (2013.01); *H01L 21/0335* (2013.01); *H01L 21/0337* (2013.01); *H01L 21/0338* (2013.01); *H01L 21/76877* (2013.01)

(58) Field of Classification Search
  CPC .......... G06F 17/30268; G06F 16/5866; G06K 2209/27; G06K 9/6276; G06T 2207/20104; G06T 7/11; G06T 7/143; G06T 7/162; H01L 21/31144; H01L 21/31138; H01L 21/0335
  USPC ....... 438/706, 710, 712, 714, 719, 723, 736; 216/41, 46
  See application file for complete search history.

(56) References Cited

U.S. PATENT DOCUMENTS

| | | | |
|---|---|---|---|
| 8,850,369 B2 | 9/2014 | Lung et al. | |
| 9,177,797 B2 | 11/2015 | Chang et al. | |
| 9,390,709 B2 | 7/2016 | Nonaka | |
| 9,551,923 B2 | 1/2017 | Wang et al. | |
| 9,911,804 B1* | 3/2018 | Mallela | H01L 29/1033 |
| 2016/0064248 A1* | 3/2016 | Lee | H01L 21/76816 |
| | | | 438/637 |
| 2016/0329435 A1* | 11/2016 | Fanelli | H01L 29/78696 |

* cited by examiner

*Primary Examiner* — Lan Vinh
(74) *Attorney, Agent, or Firm* — Thompson Hine LLP; Anthony Canale (57) ABSTRACT

Methods of fabricating an interconnect structure. A first sacrificial layer is deposited over a dielectric layer, and a block mask is formed that covers an area on the first sacrificial layer. A second sacrificial layer is deposited over the block mask and the first sacrificial layer. After the block mask is formed, the second sacrificial layer is patterned to form a mandrel that is arranged in part on a portion of the block mask.

19 Claims, 6 Drawing Sheets

INTERCONNECTS WITH CUTS FORMED BY BLOCK PATTERNING

BACKGROUND

The present invention relates to integrated circuits and semiconductor device fabrication and, more specifically, to interconnect structures and methods of fabricating an interconnect structure.

A back-end-of-line (BEOL) interconnect structure may be used to connect device structures, which are fabricated on a substrate by front-end-of-line (FEOL) processing, with each other and with the environment external to the chip. Self-aligned patterning processes used to form a BEOL interconnect structure involve mandrels as sacrificial features that establish a feature pitch. Spacers, which have a thickness that is less than a dimension permitted by the current ground rules for optical lithography, are formed adjacent to the vertical sidewalls of the mandrels. After selective removal of the mandrels, the spacers are used as an etch mask to etch an underlying hardmask to define mandrel lines over areas from which the mandrels are removed and non-mandrel lines over areas between the spacers. The pattern of mandrel and non-mandrel lines is transferred from the hardmask to an interlayer dielectric layer as trenches in which the wires of the BEOL interconnect structure are formed.

Cuts may be formed in mandrels with a cut mask and etching in order to section the mandrels before the spacers are formed and to define gaps in the cut mandrels. Non-mandrel cuts may also be formed in the hardmask itself and define gaps that are filled by dielectric material when the spacers are formed. The gaps may be subsequently used to produce wires in the patterned interlayer dielectric layer that are spaced apart at their tips with a tip-to-tip spacing based on the dimensions of the cuts.

Improved interconnect structures and methods of fabricating an interconnect structure are needed.

SUMMARY

In an embodiment of the invention, a method includes depositing a first sacrificial layer over a dielectric layer, forming a block mask covering an area on the first sacrificial layer, and depositing a second sacrificial layer over the block mask and the first sacrificial layer. After the block mask is formed, the second sacrificial layer is patterned to form a mandrel that is arranged in part on a portion of the block mask.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 11A is a diagrammatic top view in which FIG. 11 is taken generally along line 11-11.

DETAILED DESCRIPTION

Figure 1:
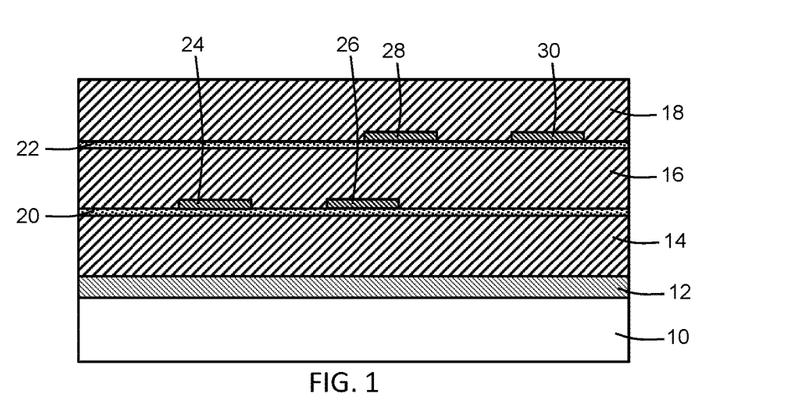
FIGS. 1-11 are cross-sectional views of a structure at successive stages of a processing method in accordance with embodiments of the invention.
Figure 1A:
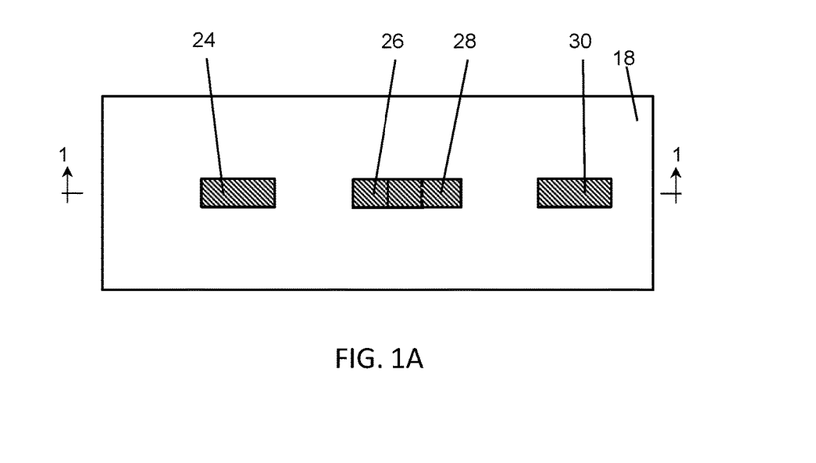
FIG. 1A is a diagrammatic top view of FIG. 1 in which the dimensions and relative locations of the block masks are illustrated.

With reference to FIGS. 1, 1A and in accordance with embodiments of the invention, an interlayer dielectric layer 10 may be comprised of an electrically-insulating dielectric material, such as hydrogen-enriched silicon oxycarbide (Si-COH) or another type of low-k dielectric material, deposited by chemical vapor deposition (CVD). The interlayer dielectric layer 10 may be located on a substrate that includes device structures fabricated by front-end-of-line (FEOL) processing to form an integrated circuit. A hardmask 12 is located on the top surface of the interlayer dielectric layer 10. The hardmask 12 may be comprised of a metal, such as titanium nitride (TiN), deposited by physical vapor deposition (PVD) and/or a dielectric material, such as silicon nitride ($Si_3N_4$), deposited by chemical vapor deposition (CVD). The hardmask 12 is removable from the interlayer dielectric layer 10 selective to the material of the interlayer dielectric layer 10. As used herein, the term "selective" in reference to a material removal process (e.g., etching) denotes that the material removal rate (i.e., etch rate) for the targeted material is higher than the material removal rate (i.e., etch rate) for at least another material exposed to the material removal process.

A layer stack that includes sacrificial layers 14, 16, 18 and etch stop layers 20, 22 is formed on a top surface of the hardmask 12. Block masks 24, 26, 28, 30 are formed at strategic locations in the layer stack and are subsequently used in the process flow to form mandrel cuts and non-mandrel cuts. The sacrificial layers 14, 16, 18 may be composed of a sacrificial material, such as amorphous silicon (α-Si), deposited by, for example, chemical vapor deposition (CVD). The etch stop layers 20, 22 may be composed of a dielectric material, such as silicon dioxide ($SiO_2$), deposited by, for example, chemical vapor deposition (CVD) or atomic layer deposition (ALD). The block masks 24, 26, 28, 30 may be composed of a dielectric material, such as aluminum dioxide ($Al_2O_3$), deposited by, for example, atomic layer deposition (ALD). The layer stack materials are selected to have a high etch selectivity relative to each other. For example, the etch selectivity of aluminum dioxide to silicon and to silicon dioxide is, respectively, 7:1 and 10:1, the etch selectivity of silicon to aluminum dioxide and to silicon dioxide is, respectively, 50:1 and 100:1, and the etch selectivity of silicon dioxide to aluminum dioxide and to silicon is, respectively, 50:1 and 10:1.

The etch stop layer 20 and sacrificial layer 14 are serially deposited on the hardmask 12. The block masks 24, 26 are formed by depositing a layer of their constituent material on the etch stop layer 20 and patterning the deposited layer with lithographic and etching processes to form the block masks 24, 26 as patterned features. The etch stop layer 22 and sacrificial layer 16 are serially deposited on the etch stop layer 20. The block masks 24, 26 are arranged between the sacrificial layer 16 and the etch stop layer 20, and are thinner than the sacrificial layer 16. The block masks 28, 30 are formed by depositing a layer of their constituent material on etch stop layer 22 and patterning the deposited layer with lithographic and etching processes to form the block masks 28, 30 as patterned features. The sacrificial layer 18 is then deposited on the etch stop layer 22. The block masks 28, 30 are arranged between the sacrificial layer 18 and the etch stop layer 22, and are thinner than the sacrificial layer 18. In vertical projection, the block mask 28 and the block mask 30 are positioned to partially overlap so as to provide, as part of the subsequent process flow, respective cuts in mandrel and non-mandrel spaces that are adjacent in position.

Figure 2:
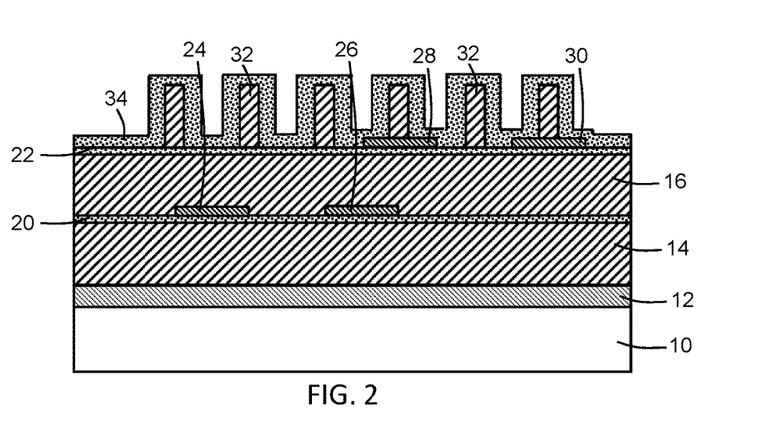

With reference to FIG. 2 in which like reference numerals refer to like features in FIG. 1 and at a subsequent fabrication stage of the processing method, mandrels 32 are formed from the sacrificial layer 18 on a top surface of the etch stop layer 22 and the block masks 28, 30 to provide overlapping relationships. For example, a sidewall image transfer (SIT) process or a self-aligned double patterning (SADP) process may be used to pattern the mandrels 32. The layout of the mandrels 32 is selected in coordination with the locations of the block masks 24, 26 and the block masks 28, 30.

A conformal layer 34 comprised of a dielectric material may be deposited using, for example, atomic layer deposition (ALD) over the mandrels 32 and the etch stop layer 22. The material constituting the conformal layer 34 may be chosen so as to be removed by a given etch chemistry selective to the material of the mandrels 32. For example, if the mandrels 32 are composed of amorphous silicon, the dielectric material constituting the conformal layer 34 may be composed of silicon dioxide ($SiO_2$) such that the mandrels 32 can be pulled or removed without removing sidewall spacers formed using the conformal layer 34.

Figure 3:
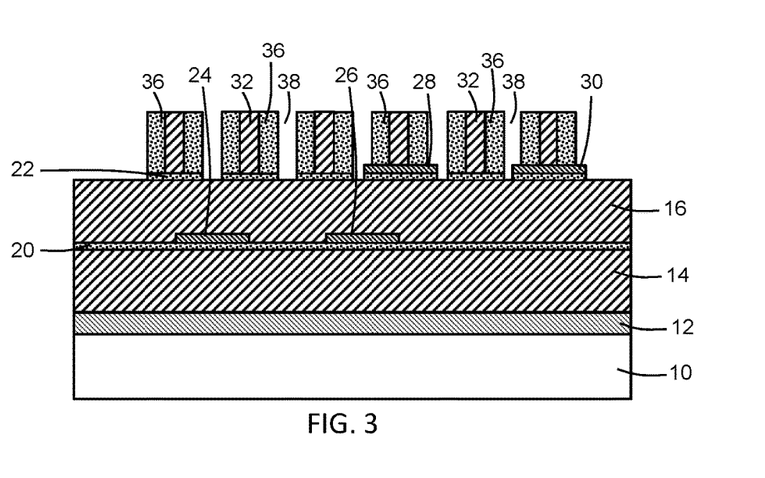

With reference to FIG. 3 in which like reference numerals refer to like features in FIG. 2 and at a subsequent fabrication stage of the processing method, sidewall spacers 36 are formed from the conformal layer 34 at locations adjacent to the vertical sidewalls of the mandrels 32. The sidewall spacers 36 may be formed by shaping the conformal layer 34 with an anisotropic etching process, such as reactive ion etching (RIE), that removes the material of the conformal layer 34 selective to the materials of the mandrels 32 and block masks 28, 30. Non-mandrel spaces 38 are defined between the groups of mandrels 32 and sidewall spacers 36. Sections of the material of the etch stop layer 22 may also be removed from the sacrificial layer 16 with an anisotropic etching process, such as reactive ion etching (ME), in the non-mandrel spaces 38. In an embodiment, the anisotropic etching process used to form the sidewall spacers 36 may also remove the sections of the etch stop layer 22 from these unmasked areas in the non-mandrel spaces 38. Areas of the block masks 28, 30 in the non-mandrel spaces 38 are exposed at the edges of the overlying sidewall spacers 36 by the etching of the conformal layer 34.

One of the mandrels 32 has a section along its length that is aligned with, and longitudinally crosses over, the block mask 28. The extent of the overlap is equal to the length of the block mask 28. The subsequent effect in the process flow is a cut in a mandrel space at the location of the block mask 28. Another of the mandrels 32 has a section along its length that is aligned with, and longitudinally crosses over, the block mask 30. The extent of the overlap is equal to the length of the block mask 30. The subsequent effect in the process flow is another cut in a different mandrel space at the location of the block mask 30. Similarly, one of the non-mandrel spaces 38 has a section along its length that is aligned with, and longitudinally crosses over (i.e., overlaps), the block mask 24. The extent of the overlap is equal to the length of the block mask 24. The subsequent effect in the process flow is a cut in this non-mandrel space 38 at the location of the block mask 24. Another of the non-mandrel spaces 38 has a section along its length that is aligned with, and longitudinally crosses over (i.e., overlaps), the block mask 26. The extent of the overlap is equal to the length of the block mask 26. The subsequent effect in the process flow is another cut in this different non-mandrel space 38 at the location of the block mask 26. The block masks 24, 26 and the block masks 28, 30 are provided in the as-deposited layer stack before the mandrels 32 and sidewall spacers 36 are formed, which differs from conventional process flows.

Figure 4:
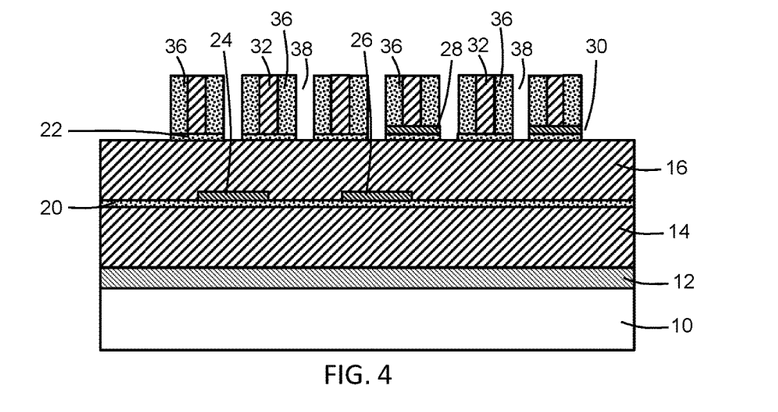

With reference to FIG. 4 in which like reference numerals refer to like features in FIG. 3 and at a subsequent fabrication stage of the processing method, an anisotropic etching process, such as reactive ion etching (RIE), of suitable etch chemistry is used to trim the exposed portions of the block masks 28, 30 in the non-mandrel spaces 38. Areas of the etch stop layer 22 in the non-mandrel spaces 38 are exposed when the exposed portions of the block masks 28, 30 are trimmed. An anisotropic etching process, such as reactive ion etching (ME), of suitable etch chemistry is used to remove these exposed areas of the etch stop layer 22. These etches adjust the dimensions of the block masks 28, 30 in a self-aligned manner such that their respective width dimensions are reduced and such that the non-mandrel spaces 38 are no longer partially covered by the block masks 28, 30. The length dimensions of the block masks 28, 30 parallel to the length dimensions of the non-mandrel spaces 38 are unchanged.

Figure 5:
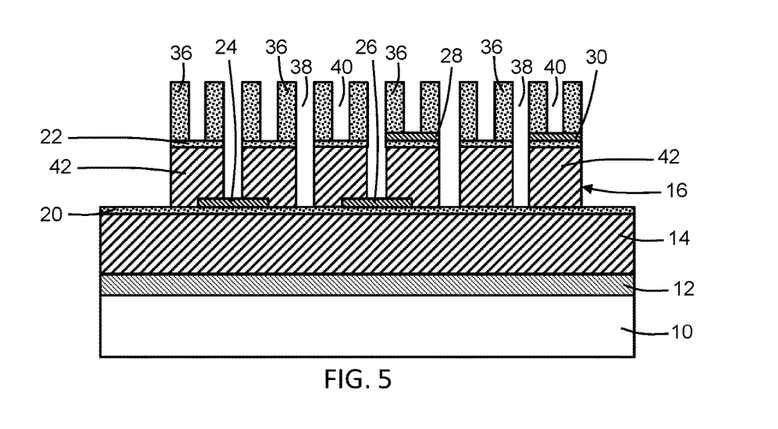

With reference to FIG. 5 in which like reference numerals refer to like features in FIG. 4 and at a subsequent fabrication stage of the processing method, the mandrels 32 are pulled and removed selective to the sidewall spacers 36 and etch stop layer 22 with an etching process having a suitable etch chemistry. The etching process removing the mandrels 32 stops on the etch stop layer 22 without penetrating through the etch stop layer 22 and into the underlying sacrificial layer 16 at the locations of the removed mandrels 32. The removal of the mandrels 32 generates mandrel spaces 40. The mandrel spaces 40 and the non-mandrel spaces 38 are arranged as parallel lines in one direction and alternate with each other in an orthogonal direction. The etching process is also selective to the block masks 24, 26 and the block masks 28, 30 such that they are not etched. The block mask 28 interrupts and cuts one of the mandrel spaces 40, and the block mask 30 similarly interrupts and cuts another of the mandrel spaces 40. The length dimension of the block masks 28, 30 determines the length dimension of the cuts in the mandrel spaces 40.

The sacrificial layer 16, which is composed of the same material as the mandrels 32, is also patterned by the etching process to form sections 42 composed of its sacrificial material. Sections of the sacrificial layer 16 are removed from areas that are not covered by the sidewall spacers 36 and the etch stop layer 22 in the non-mandrel spaces 38, which extends the non-mandrel spaces 38 through the sacrificial layer 16 to the etch stop layer 20. Adjacent sections 42 of the sacrificial layer 16 are separated from each other by one of the extended non-mandrel spaces 38. Each of the sections 42 is aligned with one of the mandrel spaces 40. The block mask 24 interrupts and cuts one of the non-mandrel spaces 38, and the block mask 26 similarly interrupts and cuts another of the non-mandrel spaces 38.

Figure 6:
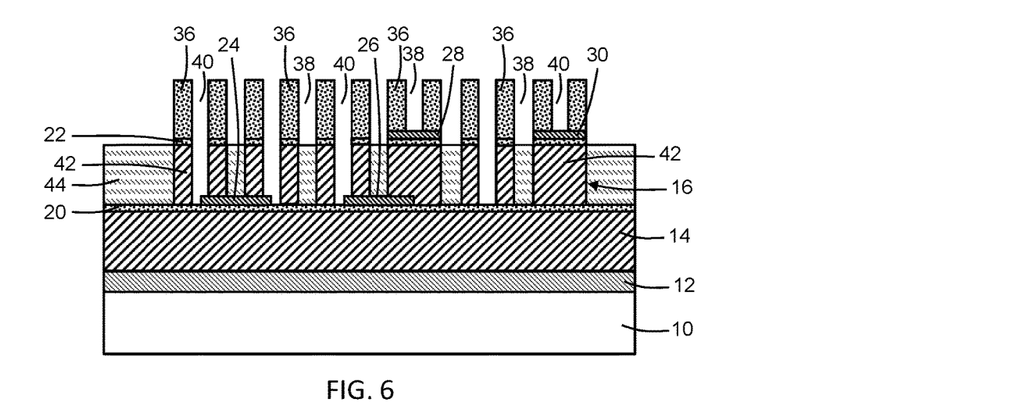

With reference to FIG. 6 in which like reference numerals refer to like features in FIG. 5 and at a subsequent fabrication stage of the processing method, an etch mask 44 is formed by applying an organic dielectric layer (ODL) with spin-coating and recessing the applied ODL with reactive ion etching to provide access from above to the sections 42 of the sacrificial layer 16 between the sidewall spacers 36. The etch stop layer 22 aligned with and exposed by the mandrel spaces 40 is removed from the sections 42 with an anisotropic etching process, such as reactive ion etching (RIE), selective to the materials of the etch mask 44, the sacrificial layer 16, and block masks 28, 30.

The mandrel spaces 40 are extended vertically into and completely through the sections 42 of the sacrificial layer 16 by an etching process. The etching process extending the mandrel spaces 40 stops on the etch stop layer 20 without penetrating into the underlying sacrificial layer 14 at the locations of the extended mandrel spaces 40. Areas of the of the block masks 24, 26 are exposed on the sacrificial layer 14 in the extended mandrel spaces 40. The mandrel spaces 40 are not extended into portions of the sections 42 covered by the block masks 28, 30, which remain intact and subsequently define mandrel cuts.

Figure 7:
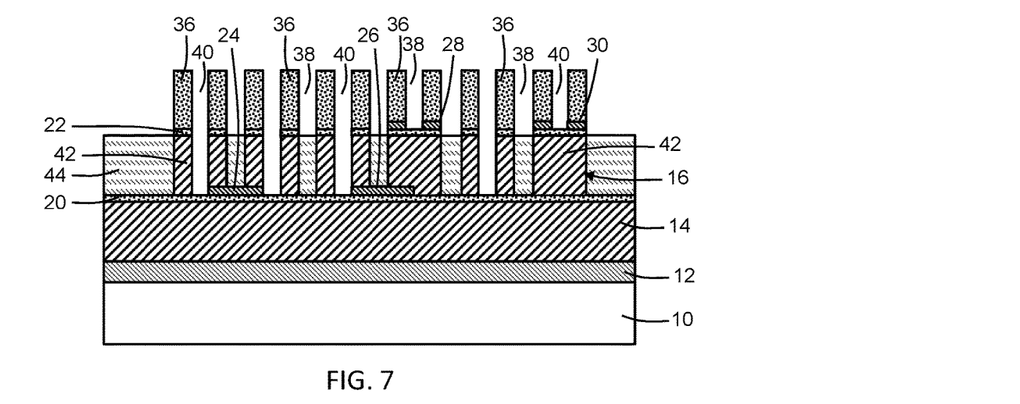

With reference to FIG. 7 in which like reference numerals refer to like features in FIG. 6 and at a subsequent fabrication stage of the processing method, an anisotropic etching process, such as reactive ion etching (RIE), of suitable etch chemistry is used to trim the exposed portions of the block masks 24, 26 inside the mandrel spaces 40. The etch mask 44 protects the areas of the block masks 24, 26 inside the non-mandrel spaces 38. These etches adjust the dimensions of the block masks 24, 26 in a self-aligned manner such that their respective width dimensions are reduced and such that the mandrel spaces 40 adjacent to the block masks 24, 26 are no longer partially covered by the block masks 24, 26. The length dimensions of the block masks 24, 26 are unchanged. Portions of the block masks 28, 30 exposed by the mandrel spaces 40 are removed by the etching process when the block mask 24, 26 are trimmed.

Figure 8:
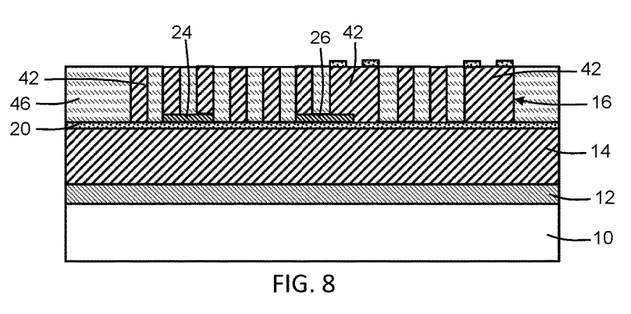

With reference to FIG. 8 in which like reference numerals refer to like features in FIG. 7 and at a subsequent fabrication stage of the processing method, the etch mask 44 is stripped to open the non-mandrel spaces 38. An etch mask 46 may be formed by applying an organic dielectric layer (ODL) with spin-coating and recessing the applied ODL with reactive ion etching to expose the sidewall spacers 36. The sidewall spacers 36, etch stop layer 22, and block masks 28, 30 are sequentially removed with etching process of suitable chemistries selective to the materials of the etch mask 46 and sacrificial layer 16. In an embodiment, the sidewall spacers 36, etch stop layer 22, and block masks 28, 30 may not be removed, in which instance the etch mask 46 is not formed.

Figure 9:
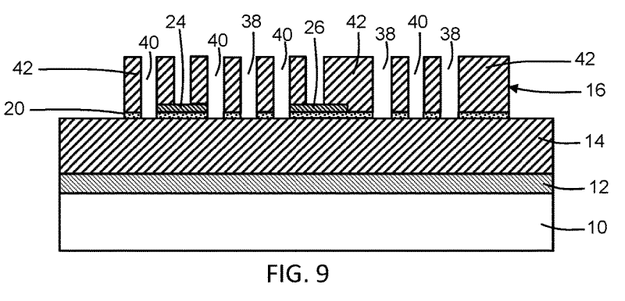

With reference to FIG. 9 in which like reference numerals refer to like features in FIG. 8 and at a subsequent fabrication stage of the processing method, the etch mask 46 is stripped to open the non-mandrel spaces 38 and the mandrel spaces 40. The unmasked sections of the etch stop layer 20 that are not covered by the sections 42 of the sacrificial layer 16 and the remainder of the etch stop layer 22 are removed with an etching process of a suitable chemistry selective to the materials of the sections 42 of sacrificial layer 16, the sacrificial layer 14, and the block masks 24, 26.

Figure 10:
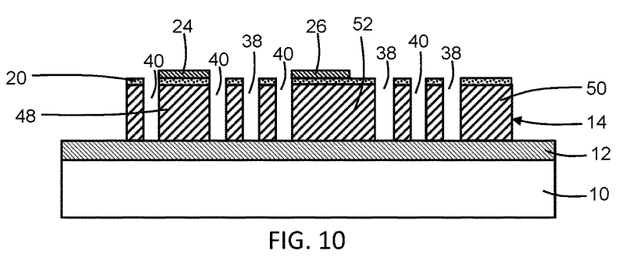

With reference to FIG. 10 in which like reference numerals refer to like features in FIG. 9 and at a subsequent fabrication stage of the processing method, the sacrificial layer 14 is etched using an etching process and an etch mask that includes the sections 42 of the sacrificial layer 16 and the block masks 24, 26. The sections 42 of the sacrificial layer 16 are removed by the etching process, which is selective to the materials of the hardmask 12, the etch stop layer 20, and the block masks 24, 26. The patterned sacrificial layer 14 includes sections that are arranged as spaced-apart parallel lines separated by either one of the non-mandrel spaces 38 or one of the mandrel spaces 40.

A cut mask 48 is formed as one of the sections of the patterned sacrificial layer 14 that is masked and protected by the trimmed block mask 24 during the etching process. The cut mask 48 interrupts the continuity of one of the non-mandrel spaces 38. The cut mask 48 subsequently provides a cut between a pair of linearly-arranged metal lines that is to be formed in the interlayer dielectric layer 10 using the associated non-mandrel space 38. The dimension of the cut mask 48 in a direction parallel to the length of the associated non-mandrel space 38 determines a tip-to-tip space or distance between the ends of linearly-aligned and subsequently-formed metal lines with ends or tips terminating at the cut and on opposite sides of the cut provided by the cut mask 48.

A cut mask 50 is formed as one of the sections of the patterned sacrificial layer 14 that is masked and protected during the etching process by the section 42 of the sacrificial layer 14 formerly coinciding with the area and location of the trimmed block mask 30. The cut mask 50 interrupts the continuity of one of the mandrel spaces 40. The cut mask 50 subsequently provides a cut between a pair of linearly-arranged metal lines subsequently formed in the interlayer dielectric layer 10 using the associated mandrel space 40. The dimension of the cut mask 50 in a direction parallel to the length of the associated mandrel space 40 determines a tip-to-tip space or distance between the ends of linearly-aligned and subsequently-formed metal lines terminating at the cut and on opposite sides of the cut provided by the cut mask 50.

A cut mask 52 is formed as one of the sections of the patterned sacrificial layer 14 that is masked and protected during the etching process by a combination of the block mask 26 and the section 42 of the sacrificial layer 14 formerly coinciding with the area and location of the trimmed block mask 28. The cut mask 52 interrupts the continuity of one of the non-mandrel spaces 38 and also interrupts the continuity of one of the mandrel spaces 40. The cut mask 52 subsequently provides a cut between a pair of linearly-arranged metal lines subsequently formed in the interlayer dielectric layer 10 using the associated non-mandrel space 38 and between a pair of linearly-arranged metal lines subsequently formed in the interlayer dielectric layer 10 using the associated mandrel space 40. The dimension of the cut mask 52 in a direction parallel to the length of the associated non-mandrel space 38 and the associated mandrel space 40 determines a tip-to-tip space or distance between the ends of the metal lines terminating at the cut and on opposite sides of the cut provided by the cut mask 52. The tip-to-tip distances are equal due to the shared length dimension of the cut mask 52.

Figure 11:
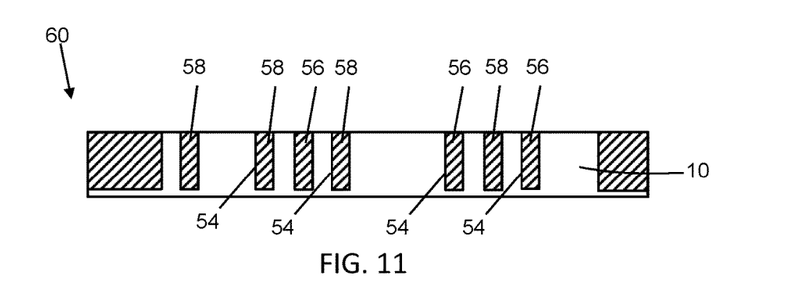
Figure 11A:
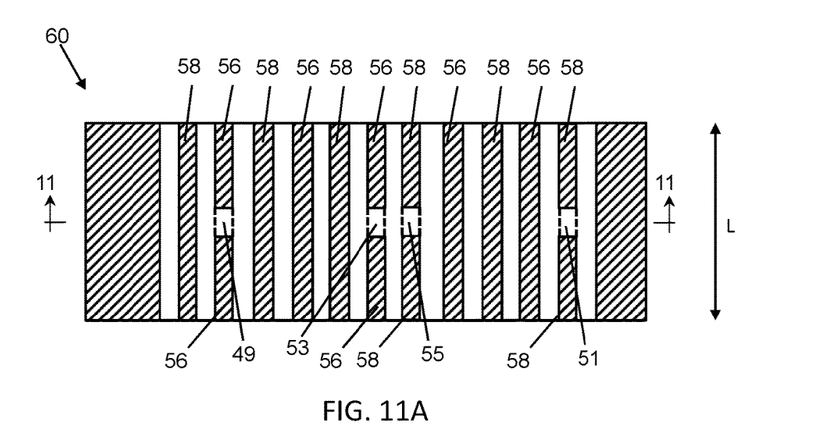

With reference to FIGS. 11, 11A in which like reference numerals refer to like features in FIG. 10 and at a subsequent fabrication stage of the processing method, the hardmask 12 is patterned by an etching process with the patterned sacrificial layer 14 operating as an etch mask to transfer the pattern of non-mandrel spaces 38 and mandrel spaces 40, as well as the cut masks 48, 50, 52 in the pattern, to the hardmask 12. The sacrificial layer 14 may be stripped after the pattern is transferred. The interlayer dielectric layer 10 is then patterned by an etching process with the patterned hardmask 12 operating as an etch mask to transfer the pattern of non-mandrel spaces 38 and mandrel spaces 40 to the interlayer dielectric layer 10 as trenches 54.

A back-end-of-line (BEOL) interconnect structure 60 is formed by filling the trenches 54 in the interlayer dielectric layer 10 with a conductor to form non-mandrel wires 56 and mandrel wires 58 as features embedded in the interlayer dielectric layer 10. A liner (not shown) comprised of titanium (Ti), titanium nitride (TiN), tantalum (Ta), tantalum nitride (TaN), or a layered combination of these materials (e.g., a bilayer of TaN/Ta) may be applied to the trenches 54 before filling with a primary electrical conductor. The primary conductor may be comprised of a low-resistivity metal formed using a deposition process, such as copper (Cu) or cobalt (Co) deposited by electroplating or electroless deposition. The shapes and geometries of the wires 56, 58 reflect the areas exposed for trench formation in the interlayer dielectric layer 10 by the patterned hardmask 12. In an embodiment, the wires may be conductive features located in a first metallization (MO) level that is the closest of multiple metallization levels of the BEOL interconnect structure 60 to FEOL device structures, and in which wires 56, 58 may be connected with FEOL device structures by vertical contacts in a contact (CA) level.

The cut mask 48 in the hardmask pattern is transferred to the interlayer dielectric layer 10 as a cut 49 between linearly-aligned non-mandrel wires 56 defining an area over which the interlayer dielectric layer 10 is not etched and remains intact. The non-mandrel wires 56 have a tip-to-tip spacing between their respective ends, which are broken by the insertion of the dielectric material of the interlayer dielectric layer 10 in the cut 49, given by a length dimension of the cut 49 parallel to the length, L, of the wires 56. The cut mask 50 in the hardmask pattern is transferred to the interlayer dielectric layer 10 as a cut 51 between linearly-aligned mandrel wires 58 defining an area over which the interlayer dielectric layer 10 is not etched and remains intact. The mandrel wires 58 have a tip-to-tip spacing between their respective ends, which are broken by the insertion of the dielectric material of the interlayer dielectric layer 10 in the cut 51, given by a length dimension of the cut 51 parallel to the length of the wires 58.

The cut mask 52 in the hardmask pattern is transferred to the interlayer dielectric layer 10 as a cut 53 between linearly-aligned non-mandrel wires 56 and as a cut 55 between linearly-aligned mandrel wires 58 each defining respective areas over which the interlayer dielectric layer 10 is not etched and remains intact. The non-mandrel wires 56 have a tip-to-tip spacing between their respective ends, which are broken by the insertion of the dielectric material of the interlayer dielectric layer 10 in the cut 53, given by a length dimension of the cut 53 parallel to the length of the wires 56. The mandrel wires 58 have a tip-to-tip spacing between their respective ends, which are broken by the insertion of the dielectric material of the interlayer dielectric layer 10 in the cut 55, given by a length dimension of the cut 55 parallel to the length of the wires 58. The non-mandrel wires 56 cut by the cut 53 are positioned adjacent to the mandrel wires 58 cut by the cut 55, which in turn may be arranged adjacent to cut 53.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   depositing a first sacrificial layer over a dielectric layer;
   forming a first block mask that covers an area on the first sacrificial layer;
   depositing a second sacrificial layer over the first block mask and the first sacrificial layer; and
   after the first block mask is formed, patterning the second sacrificial layer to form a first mandrel that is arranged in part on a first portion of the first block mask,
   wherein the first sacrificial layer is deposited on a third sacrificial layer arranged between the first sacrificial layer and the dielectric layer, and further comprising:
   before depositing the first sacrificial layer, forming a second block mask covering an area on the third sacrificial layer.

2. The method of claim 1 wherein the second sacrificial layer is patterned by an etching process that removes the first sacrificial layer selective to the first block mask.

3. The method of claim 2 wherein an etch stop layer is formed on the first sacrificial layer before the first block mask is formed, and the etching process used to pattern the second sacrificial layer removes the first sacrificial layer selective to the etch stop layer.

4. The method of claim 3 wherein the first sacrificial layer and the second sacrificial layer are composed of amorphous silicon, the first block mask is composed of aluminum oxide, and the etch stop layer is composed of silicon dioxide.

5. The method of claim 1 wherein patterning the second sacrificial layer to form the first mandrel comprises:
   etching the second sacrificial layer selective to the first block mask.

6. The method of claim 5 further comprising:
   after the second sacrificial layer is etched, forming a sidewall spacer on a second portion of the first block mask adjacent to the first portion of the first block mask and the first mandrel.

7. The method of claim 5 wherein an etch stop layer is formed on the first sacrificial layer before the first block mask is formed, and the second sacrificial layer is etched selective to the etch stop layer when patterning the second sacrificial layer to form the first mandrel.

8. The method of claim 1 wherein a second mandrel is formed when the second sacrificial layer is patterned, and further comprising:
   forming a first sidewall spacer on the first mandrel and a second sidewall spacer on the second mandrel to define a non-mandrel line as a space between the first sidewall spacer and the second sidewall spacer.

9. The method of claim 8 further comprising:
etching the second sacrificial layer with a first etching process to vertically transfer the non-mandrel line from the second sacrificial layer to the first sacrificial layer and form a non-mandrel line in the first sacrificial layer,
wherein the non-mandrel line in the first sacrificial layer is arranged on a portion of the second block mask, and the second sacrificial layer is etched selective to the second block mask, the first sidewall spacer, and the second sidewall spacer.

10. The method of claim 9 wherein the first block mask includes a second portion exposed by the non-mandrel line, and further comprising:
before etching the second sacrificial layer, trimming the second portion of the first block mask with a second etching process.

11. The method of claim 9 further comprising:
etching the third sacrificial layer with a second etching process to vertically transfer the non-mandrel line from the first sacrificial layer to the third sacrificial layer and form a non-mandrel line in the third sacrificial layer,
wherein the second block mask preserves an underlying section of the third sacrificial layer when the third sacrificial layer is etched by the second etching process.

12. The method of claim 11 further comprising:
etching the dielectric layer with a third etching process to vertically transfer the non-mandrel line from the third sacrificial layer to the dielectric layer as a first trench and a second trench, and to transfer the section of the third sacrificial layer as a cut arranged between an end of the first trench and an end of the second trench.

13. The method of claim 9 wherein the first mandrel and the second mandrel are removed selective to the first block mask to form a first mandrel line and a second mandrel line when the second sacrificial layer is etched with the first etching process, and the first portion of the first block mask is exposed when the first mandrel is removed.

14. The method of claim 13 wherein a first etch stop layer is formed on the first sacrificial layer before the first block mask is formed, and patterning the second sacrificial layer to form the first mandrel comprises:
etching the second sacrificial layer selective to the first etch stop layer.

15. The method of claim 14 wherein a second etch stop layer is formed on the third sacrificial layer before the second block mask is formed, and the first etching process etches the second sacrificial layer selective to the second etch stop layer when forming the non-mandrel line in the first sacrificial layer.

16. The method of claim 13 further comprising:
etching the first sacrificial layer with a second etching process to transfer the first mandrel line and the second mandrel line to the first sacrificial layer,
wherein the first block mask preserves an underlying section of the first sacrificial layer when the first sacrificial layer is etched.

17. The method of claim 16 further comprising:
filling the non-mandrel line in the first sacrificial layer with a hardmask before the first sacrificial layer is etched with the second etching process.

18. The method of claim 16 further comprising:
etching the third sacrificial layer with a third etching process to vertically transfer the first mandrel line and the second mandrel line from the first sacrificial layer to the third sacrificial layer and form a first mandrel line and a second mandrel line in the third sacrificial layer,
wherein the section of the first sacrificial layer preserves an underlying section of the third sacrificial layer when the third sacrificial layer is etched by the third etching process.

19. The method of claim 18 further comprising:
etching the dielectric layer to vertically transfer the first mandrel line from the third sacrificial layer to the dielectric layer as a first trench and a second trench, and to transfer the section of the third sacrificial layer as a cut arranged between an end of the first trench and an end of the second trench.

* * * * *